(12) United States Patent
Liu (10) Patent No.: US 11,864,377 B2
(45) Date of Patent: Jan. 2, 2024

(54) SEMICONDUCTOR STRUCTURE AND METHOD FOR MANUFACTURING SAME (71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 161 days.

(21) Appl. No.: 17/477,758

(22) Filed: Sep. 17, 2021

(65) Prior Publication Data

US 2022/0059547 A1 Feb. 24, 2022

Related U.S. Application Data (63) Continuation of application No. PCT/CN2021/100700, filed on Jun. 17, 2021.

(30) Foreign Application Priority Data

Aug. 20, 2020 (CN) .......................... 202010843298.8

(51) Int. Cl.
*H01L 27/108* (2006.01)
*H10B 12/00* (2023.01)
(52) U.S. Cl.
CPC .......... *H10B 12/482* (2023.02); *H10B 12/30* (2023.02)
(58) Field of Classification Search
CPC ..... H10B 12/482; H10B 12/30; H10B 12/485
See application file for complete search history.

(56) References Cited

U.S. PATENT DOCUMENTS

| 6,521,963 | B1 * | 2/2003 | Ota | H01L 29/6656 257/350 |
|---|---|---|---|---|
| 8,507,349 | B2 | 8/2013 | Lee | |
| 9,876,108 | B2 | 1/2018 | Ching et al. | |
| 2011/0127611 | A1 | 6/2011 | Lee | |
| 2013/0292776 | A1 | 11/2013 | Lee | |
| 2016/0365345 | A1 | 12/2016 | Ching et al. | |

FOREIGN PATENT DOCUMENTS

| CN | 100547797 | C | 10/2009 |
|---|---|---|---|
| CN | 103094345 | A | 5/2013 |
| CN | 109003938 | A | 12/2018 |
| CN | 110364483 | A | 10/2019 |
| CN | 111092081 | A | 5/2020 |
| CN | 111584432 | A | 8/2020 |

* cited by examiner

*Primary Examiner* — Mohammed R Alam
(74) *Attorney, Agent, or Firm* — Cooper Legal Group, LLC (57) ABSTRACT A semiconductor structure includes: a substrate, a first conductive layer disposed on the substrate, a second conductive layer disposed on a surface of the first conductive layer away from the substrate, and third conductive layers covering side walls of the first conductive layer and in contact with the second conductive layer. Contact resistance between the third conductive layers and the second conductive layer is less than contact resistance between the first conductive layer and the second conductive layer.

20 Claims, 11 Drawing Sheets

SEMICONDUCTOR STRUCTURE AND METHOD FOR MANUFACTURING SAME

CROSS-REFERENCE TO RELATED APPLICATIONS

This application is a continuation of International Application No. PCT/CN2021/100700, filed on Jun. 17, 2021, which claims priority to Chinese Patent Application No. 202010843298.8, filed on Aug. 20, 2020. The disclosures of International Application No. PCT/CN2021/100700 and Chinese Patent Application No. 202010843298.8 are hereby incorporated by reference in their entireties.

TECHNICAL FIELD

The embodiments of the disclosure relate to the field of semiconductors, and particularly relates to a semiconductor structure and a method for manufacturing the same.

BACKGROUND

A memory is a memory component used to store programs and various data information, and may be divided into a read-only memory and a random access memory according to usage types of memories. The memory usually includes a capacitor and a transistor connected to the capacitor. The capacitor is used to store charges representing stored information, and the transistor is a switch that controls inflow and release of charges of the capacitor. A source, a drain, and a gate are formed in the transistor, and the drain is connected to a bit line.

However, with the process nodes continuously getting smaller, the problem of blockage of memory signal transmission is becoming increasingly serious. How to solve this problem has become an important direction for memory process optimization.

SUMMARY

The embodiments of the disclosure provide a semiconductor structure and a method for manufacturing the same, which are favorable for improving the signal transmission performance of the semiconductor structure.

In order to solve the problem above, the embodiments of the disclosure provide a semiconductor structure, including: a substrate, a first conductive layer disposed on the substrate, a second conductive layer disposed on a surface of the first conductive layer away from the substrate, and third conductive layers covering side walls of the first conductive layer and being in contact with the second conductive layer. Contact resistance between the third conductive layers and the second conductive layer is less than contact resistance between the first conductive layer and the second conductive layer.

Correspondingly, the embodiments of the disclosure further provide a method for manufacturing a semiconductor structure, including: providing a substrate and a bit line structure disposed on the substrate, the bit line structure including a first conductive layer, a second conductive layer, a metal conductive layer and a top-layer dielectric layer which are stacked in sequence; and forming third conductive layers covering side walls of the first conductive layer and in contact with the second conductive layer, contact resistance between the third conductive layers and the second conductive layer being less than contact resistance between the first conductive layer and the second conductive layer.

BRIEF DESCRIPTION OF THE DRAWINGS

One or more embodiments are exemplified by the corresponding accompanying drawings. These exemplified descriptions do not constitute a limitation to the embodiments. Elements with the same reference numerals in the accompanying drawings are shown as similar elements. The drawings in the accompanying drawings do not constitute scaling restrictions unless otherwise stated.

DETAILED DESCRIPTION

In order to make the objectives, the technical solutions and the advantages of the embodiments of the disclosure clearer, detailed descriptions will be made to all the embodiments of the disclosure below in combination with the accompanying drawings. However, those of ordinary skill in the art can understand that in the various embodiments of the disclosure, many technical details are presented in order to make the disclosure better understood by readers. However, the technical solutions claimed in the disclosure can also be implemented without these technical details and various changes and modifications based on the embodiments.

Figure 1:
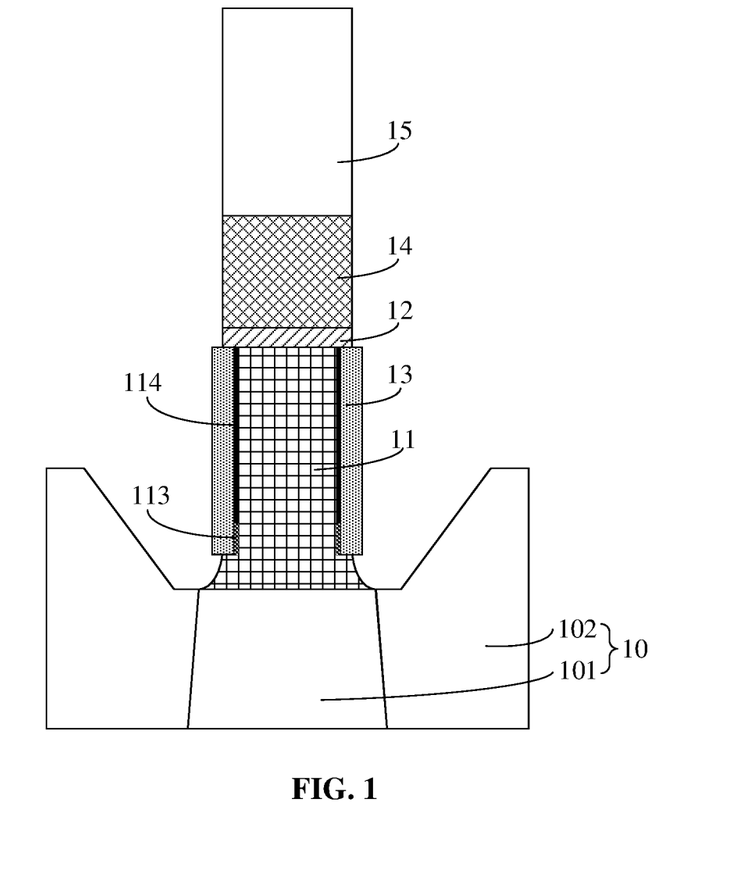
FIG. 1 to FIG. 5 are sectional structure views of different semiconductor structures provided in the embodiments of the disclosure.

Referring to FIG. 1, the semiconductor structure includes a substrate 10, a first conductive layer 11 disposed on the substrate 10, a second conductive layer 12 disposed on a surface of the first conductive layer 11 away from the substrate 10, and third conductive layers 13 covering side walls of the first conductive layer 11 and being in contact with the second conductive layer 12. Contact resistance between the third conductive layers 13 and the second conductive layer 12 is less than contact resistance between the first conductive layer 11 and the second conductive layer 12.

In the present embodiment, an active region 101 is disposed within the substrate 10. Both sides of the active region 101 further have isolation structures 102. In a direction perpendicular to a surface of the substrate 10, a top width of each isolation structure 102 is usually greater than a bottom width, so that the top width of the active region 101 disposed between adjacent isolation structures 102 is usually less than the bottom width. In order to achieve a larger contact area between the first conductive layer 11 and the active region 101, an exposure area of the active region 101 may be enlarged by etching the substrate 10, so that the contact resistance between the first conductive layer 11 and the active region 101 is reduced, and the current transmission effect is improved.

In the present embodiment, the setting of the third conductive layers 13 is equivalent to connecting a resistor in parallel between the second conductive layer 12 and the substrate 10. The parallel connection of the resistor will reduce the total resistance on a conductive path between the second conductive layer 12 and the substrate 10, thus increasing the current transmission rate and increasing the current margin. In addition, the contact resistance between the third conductive layers 13 and the second conductive layer 12 is lower, so that the setting of the third conductive layers 13 is equivalent to connecting a resistor with lower resistance in parallel. Since the total resistance of multiple parallel connected resistors is less than the minimum resistance in the multiple resistors, the setting of the third conductive layer 13 is favorable for further reducing the total resistance of the conductive path to achieve better current transmission effect.

Figure 2:
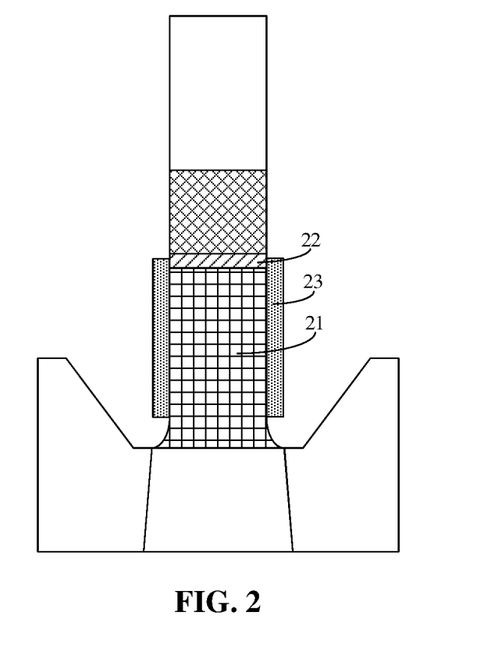

In the present embodiment, a top surface of each third conductive layer 13 is in contact with a bottom surface of the second conductive layer 12. As such, it is favorable for reducing the contact resistance in a direction perpendicular to the bottom surface of the second conductive layer 12, so that a current signal passing through the bottom surface of the second conductive layer 12 has a better signal transmission effect. In other embodiments, referring to FIG. 2, the third conductive layers 23 are in contact with side walls of the second conductive layer 22. The contact area is enlarged, so that the contact between the third conductive layers 23 and the side walls of the second conductive layer 22 can also play a role in reducing the total resistance of the conductive path.

Figure 3:
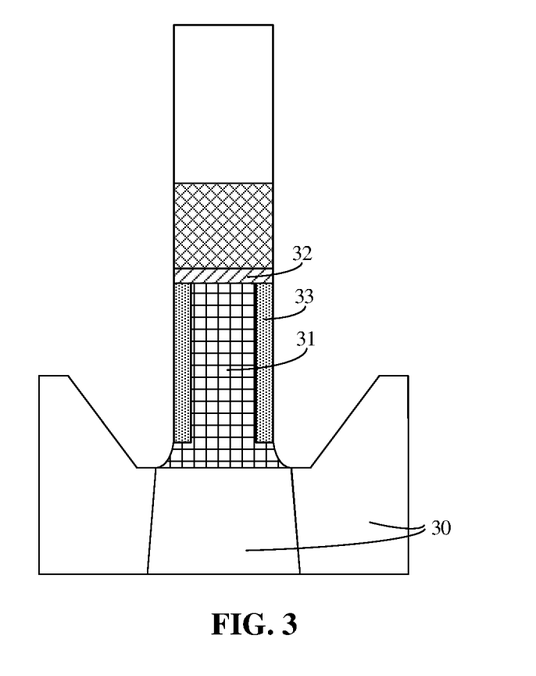

In the present embodiment, in a direction parallel to a surface of the substrate 10, the third conductive layers 13 partially protrude relative to the second conductive layer 12. In other embodiments, referring to FIG. 3, in a direction perpendicular to the surface of the substrate 30, an orthographic projection of the third conductive layers 33 overlaps a boundary of an orthographic projection of the second conductive layer 32. In another embodiment, the orthographic projection of the third conductive layers may also be disposed in the orthographic projection of the second conductive layer.

In the present embodiment, each side wall of the first conductive layer 11 includes a first sub-side wall 113 and a second sub-side wall 114 which extend upward from a bottom of the first conductive layer 11. The first sub-side wall 113 is disposed between the second sub-side wall 114 and the bottom of the first conductive layer 11. Each third conductive layer 13 covers a respective second sub-side wall. Each third conductive layer 13 only covers part of a respective side wall of the first conductive layer 11, which is favorable for avoiding formation of a new interface by the contact between the third conductive layer 13 and the substrate 10, thus avoiding the formation of the new interface from destroying a signal transmission characteristic between the first conductive layer 11 and the substrate 10.

In the present embodiment, in the direction perpendicular to the surface of the substrate 10, a ratio of a height of the second sub-side wall to a height of the first sub-side wall is 5 to 10, such as 6, 8, or 9. A height range of the first sub-side wall is 2 nm to 10 nm, and a height range of the second sub-side wall is 10 nm to 50 nm. A ratio within this range is used, which is favorable for ensuring that there is a larger contact area between the third conductive layers 13 and the first conductive layer 11 so that the third conductive layer 13 has a better effect of reducing the total resistance, and is also favorable for avoiding signal crosstalk between the substrate 10 and the third conductive layer 13 caused by that the third conductive layer 13 and the substrate 10 are too close to each other, thus avoiding a signal in the substrate 10 from interfering with a signal in the second conductive layer 12.

In the present embodiment, in the direction perpendicular to the surface of the substrate 10, the first conductive layer 11 is also disposed between the third conductive layers 13 and the substrate 10 to achieve the purpose of isolating the third conductive layers 13 from the substrate 10.

In the present embodiment, the active region 101 includes an N-type doped semiconductor layer.

In the present embodiment, the active region 101 is a drain, the first conductive layer 11 is a bit line contact, and the second conductive layer 12 is a barrier layer. The signal in the bit line structure needs to be transmitted to the drain through the second conductive layer 12 and the first conductive layer 11 to realize storage of data.

A material of the active region 101 may be monocrystalline silicon. A material of the first conductive layer 11 may be polycrystalline silicon. In addition, the material of the first conductive layer 11 may be N-type doped polycrystalline silicon. The ion doping in the first conductive layer 11 may be heavy doping. As such, it is favorable for enabling the first conductive layer 11 to have good conductivity. The bit line structure is in contact with the active region through the polycrystalline silicon, so that the problems of junction stress and junction leakage of the active region generated by a contact interface formed by direct contact between metal and silicon can be avoided.

In the present embodiment, in the direction parallel to the surface of the substrate 10, thicknesses of the third conductive layer 13 at different positions of the side walls of the first conductive layer 11 are equal. It should be noted that the expression "equal" does not refer to absolute numerical equality, but is restrained by the technological level. When a difference between two parts is within a preset range and does not affect the structural performance, the thickness can be considered as being "equal".

Figure 4:
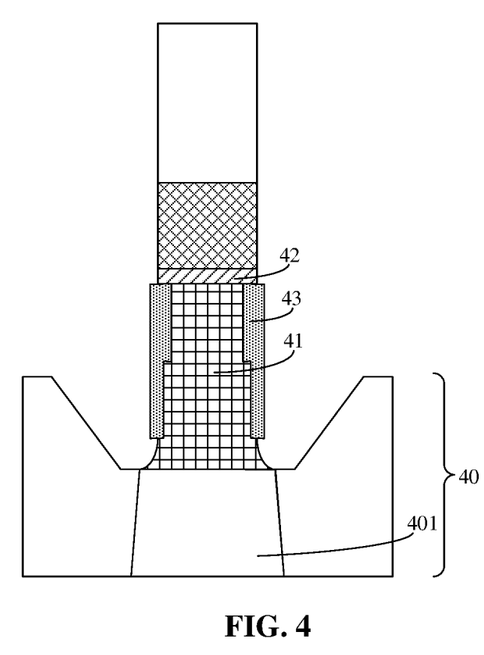

In other embodiments, referring to FIG. 4, in the direction parallel to the surface of the substrate 40, a top width of each third conductive layer 43 is greater than a bottom width of the third conductive layer.

Since the flow of a current has a tendency, i.e., in a flowing direction of the current, the current is more likely to flow towards lower resistance. In the direction parallel to the surface of the substrate 40, the greater a width of the third conductive layer 43 is, the larger a cross-sectional area of the conductive path between the substrate 40 and the second conductive layer 42 is, and the lower the resistance of the conductive path is.

By controlling the top width of each third conductive layer 43 to be greater than its bottom width, it is favorable for enabling the conductive path to have a lower resistance on a side close to the second conductive layer 42 and have a higher resistance on a side close to the substrate 40. As such, it is favorable for ensuring that the current signal in the second conductive layer 42 can be transmitted to the substrate 40, and preventing the signal in the substrate 40 from being transmitted to the second conductive layer 42, so as to avoid the current signal in the substrate 40 from interfering with the current signal in the second conductive layer 42.

It should be noted that since the third conductive layer 43 is not in contact with the active region 401, the problems of junction stress and junction leakage of the active region are avoided.

In addition, in the direction parallel to the surface of the substrate 40, a top width of the first conductive layer 41 is less than a bottom width. As such, part of the third conductive layer 43 may be disposed between the first conductive layer 41 and the second conductive layer 42, so as to reduce the protrusion of the third conductive layer 43 relative to the second conductive layer 42, so that the overall structure occupies a smaller space position, which is beneficial to reserve a larger space for other structures disposed between adjacent bit line structures and reduce the size of the semiconductor structure. In another embodiment of the disclosure, referring to FIG. 5, the surface of the sidewall of the first conductive layer 51 is a curved surface. In a direction from the second conductive layer 52 towards the substrate 50, a width of the first conductive layer 51 in the direction parallel to the surface of the substrate 50 increases gradually. Correspondingly, in the direction from the second conductive layer 52 towards the substrate 50, a width of the third conductive layer 53 in the direction parallel to the surface of the substrate 50 decreases gradually.

In the present embodiment, the semiconductor structure further includes: a metal conductive layer 14 and a top-layer dielectric layer 15. The metal conductive layer 14 is disposed on a side of the second conductive layer 12 away from the first conductive layer 11, and the second conductive layer 12 is used to prevent metal in the metal conductive layer 14 from diffusing. The top-layer dielectric layer 15 is disposed on a side of the metal conductive layer 14 away from the substrate 10, and functions as electrical isolation.

In the present embodiment, the first conductive layer 11, the second conductive layer 12, the third conductive layers 13, the metal conductive layer 14 and the top-layer dielectric layer 15 jointly form a bit line structure. The first conductive layer 11 serves as a bit line contact. The second conductive layer 12 serves as a barrier layer. The metal conductive layer 14 serves as a bit line conductive layer. The top-layer dielectric layer 15 serves as a bit line protection layer.

In the present embodiment, the material of the first conductive layer 11 is polycrystalline silicon, and the materials of the second conductive layer 12 and the third conductive layer 13 include metal compounds. The third conductive layers 13 with a material type that is the same as that of the second conductive layer 12 are used, so that there is lower resistance between the second conductive layer 12 and the third conductive layers 13. In other embodiments, the material of the first conductive layer may also be other conductive materials. The signal in the metal conductive layer 14 needs to be transmitted to the active region through the first conductive layer 11 and the second conductive layer 12 to achieve storage of data. Due to the reduction of the contact resistance, the read and write performance of a memory can be improved.

In addition, the contact resistance between the third conductive layers 13 and the first conductive layer 11 is less than the contact resistance between the second conductive layer 12 and the first conductive layer 11. As such, it is beneficial to further improve the signal transmission effect between the second conductive layer 12 and the substrate 10.

Specifically, the material of the second conductive layer 12 includes titanium nitride, and the material of the third conductive layer 13 includes metal silicide. The metal silicide includes cobalt silicide or titanium silicide.

In the present embodiment, the third conductive layers having a lower contact resistance with the second conductive layer are set, so that a total contact resistance between the second conductive layer and other active regions is reduced, thus further reducing resistance on the conductive path disposed between the second conductive layer and the substrate and ensuring that the current signal passing from the second conductive layer to the substrate has a better signal transmission effect.

Correspondingly, the embodiments of the disclosure further provide a method for manufacturing a semiconductor structure, which can be used to manufacture the above-mentioned semiconductor structure. In addition, the bit line structure may be formed by means of a self-aligned double-patterning (SADP) process and a self-aligned quadruple patterning (SAQP) process.

FIG. 6 to FIG. 9 are sectional structure views corresponding to all steps of a method for manufacturing a semiconductor structure provided in one embodiment of the disclosure.

Figure 6:
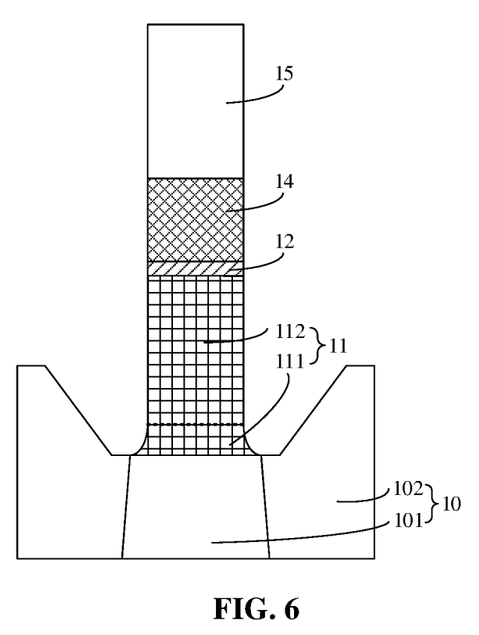
FIG. 6 to FIG. 9 are sectional structure views corresponding to all steps of a method for manufacturing a semiconductor structure provided in one embodiment of the disclosure.

Referring to FIG. 6, a substrate 10 and a first conductive layer 11 and a second conductive layer 12 which are stacked on the substrate 10 in sequence are provided. The second conductive layer 12 is disposed on a surface of the first conductive layer 11 away from the substrate 10.

The semiconductor structure further includes a metal conductive layer 14 disposed on a surface of the second conductive layer 12 away from the substrate 10, and a top-layer dielectric layer 15 disposed on a surface of the metal conductive layer 14 away from the substrate 10. The metal conductive layer 14 is used to transmit a bit line signal, and may be made of a metal material such as tungsten, titanium, and tantalum. The top-layer dielectric layer 15 is used to function as electrical isolation, and may be made of a metal nitride such as titanium nitride, tantalum nitride, and tungsten nitride. The first conductive layer 11, the second conductive layer 12, the metal conductive layer 14, the top-layer dielectric layer 15 and subsequently formed third conductive layers form a bit line structure.

In the present embodiment, the substrate 10 internally has an isolation structure 102 and an active region 101 disposed between adjacent isolation structures 102. The first conductive layer 11 is electrically connected to the active region 101. The first conductive layer 11 may be an N-type doped polycrystalline silicon, and the active region 101 may be an N-type doped monocrystalline silicon.

In the present embodiment, the first conductive layer 11 can be divided into a bottom conductive layer 111 and a top conductive layer 112 according to a difference in sidewall topography at different positions of the first conductive layer 11. The bottom conductive layer 111 is in contact with the active region 101. The top conductive layer 112 is in contact with the second conductive layer 12. In a direction perpendicular to a surface of the substrate 10, an orthographic projection of the top conductive layer 112 overlaps a boundary of an orthographic projection of the second conductive layer 12 or is disposed within the orthographic projection of the second conductive layer 12. The orthographic projection of the top conductive layer 112 is disposed within an orthographic projection of the bottom conductive layer 111.

The bottom conductive layer 111 completely covers an exposed surface of the active region 101, so as to isolate the subsequently formed third conductive layers and the active region 101 and avoid direct contact between the third conductive layers and the active region 101. Correspondingly, the bottom conductive layer 111 can function as isolation, so the top conductive layer 112 can have a less width, thereby reducing the size of the bit line structure and reserving a larger space for other structures disposed between adjacent bit line structures.

Reasons for the formation of the bottom conductive layer 111 include reduction of etching components and concentration of the etching components toward an etching center in an etching process, resulting in that the material of part of the first conductive layer 11 is not etched.

Figure 7:
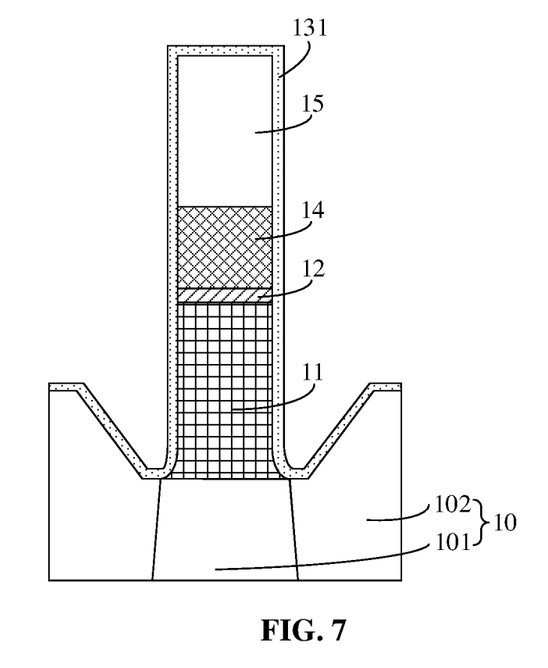

Referring to FIG. 7, a metal film 131 to be etched is formed.

The metal film 131 covers a surface of the substrate 10, side walls of the first conductive layer 11, side walls of the second conductive layer 12, side walls of the metal conductive layer 14, and side walls and a top surface of the top-layer dielectric layer 15. The metal film 131 may be formed by an atomic layer deposition process to better control a thickness of the metal film 131 disposed on the side walls of the first conductive layer 11, thereby controlling the thicknesses of the subsequently formed third conductive layers in the direction parallel to the surface of the substrate 10.

Figure 8:
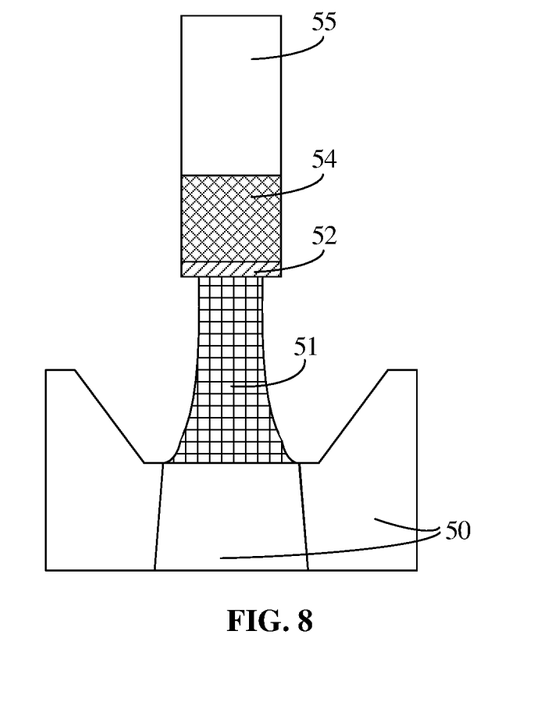

In other embodiments, referring to FIG. 8, the first conductive layer 51 is etched to form curved side wall before the metal film is formed. In a direction from the second conductive layer 52 towards the substrate 50, a width of the first conductive layer 51 in the direction parallel to the surface of the substrate 50 increases gradually. As such, the first conductive layer 51 can accommodate part of the subsequently formed third conductive layer, so as to reduce the width of the bit line structure in the direction parallel to the surface of the substrate 50 and the space volume occupied by the bit line structure.

Figure 9:
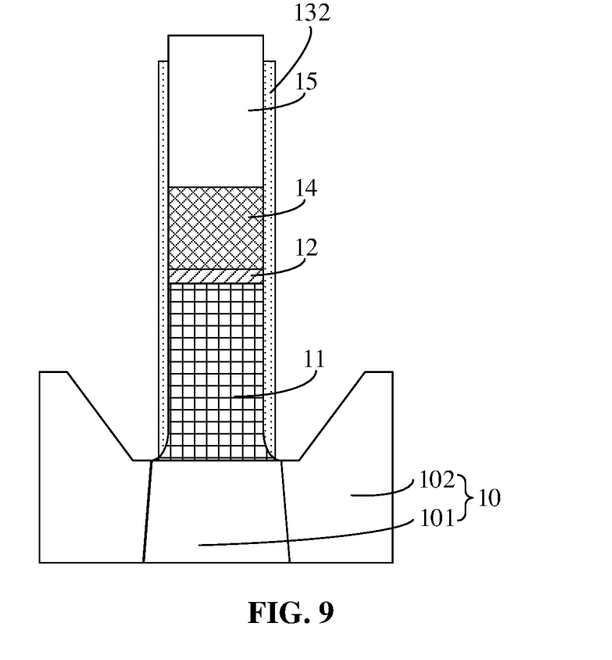

Referring to FIG. 9, the metal film 131 is etched (referring to FIG. 7) to form metal layers 132 to be reacted.

In the present embodiment, a dry etching process can be used to remove the metal film 131 on the surface of the substrate 10 to form the metal layers 132. The etched metal layers 132 at least cover parts of the side walls of the first conductive layer 11, the side walls of the second conductive layer 12 and the side walls of the metal conductive layer 14. As such, it is beneficial to prevent the second conductive layer 12 and the metal conductive layer 14 from being damaged in the etching process, and to prevent the second conductive layer 12 and the metal conductive layer 14 from being damaged in the subsequent forming process of the third conductive layer, so that a bit line signal has a better transmission effect.

In addition, parts of the metal film 131 on the bottom side walls of the first conductive layer 11 can also be removed to avoid the metal film at the positions from reacting with the first conductive layer 11 disposed between the metal layers 132 and the substrate 10 in the procedure of the subsequent process, thus avoiding the third conductive layers from contacting the active region 101 due to the consumption of the first conductive layer 11.

Figure 10:
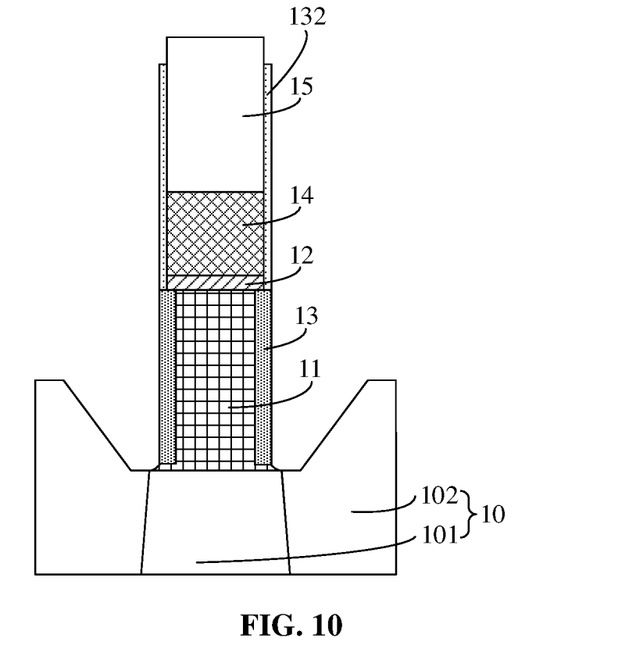
FIG. 10 is a sectional structure view corresponding to one in a method for manufacturing a semiconductor structure provided in another embodiment of the disclosure.

Referring to FIG. 10, a high-temperature process is performed to transform the metal layers 132 covering the side walls of the first conductive layer 11 into metal silicide layers to form the third conductive layers 13.

In the present embodiment, a material of the metal layers 132 includes cobalt or titanium. The high-temperature process causes the metal layers 132 covering the first conductive layer 11 to react with silicon atoms in the first conductive layer 11 to form a metal silicide, and form the third conductive layers 13. In other embodiments, an ion implantation process can be used to implant silicon atoms and other atoms into the metal layers to transform part or the entire of the metal layers into the third conductive layers.

Compared with the ion implantation process, the high-temperature process is used to form the third conductive layer, which is beneficial to enable the third conductive layers 13 to contact the bottom surface of the second conductive layer 12, so that by means of etching the third conductive layers 13, in the direction perpendicular to the surface of the substrate 10, an orthographic projection of the third conductive layers 13 is disposed within the orthographic projection of the second conductive layer 12.

After the high-temperature process is performed, the unreacted metal layers 132 on the side walls of the bit line structure are removed, and the structure shown in FIG. 1 can be formed.

Figure 5:
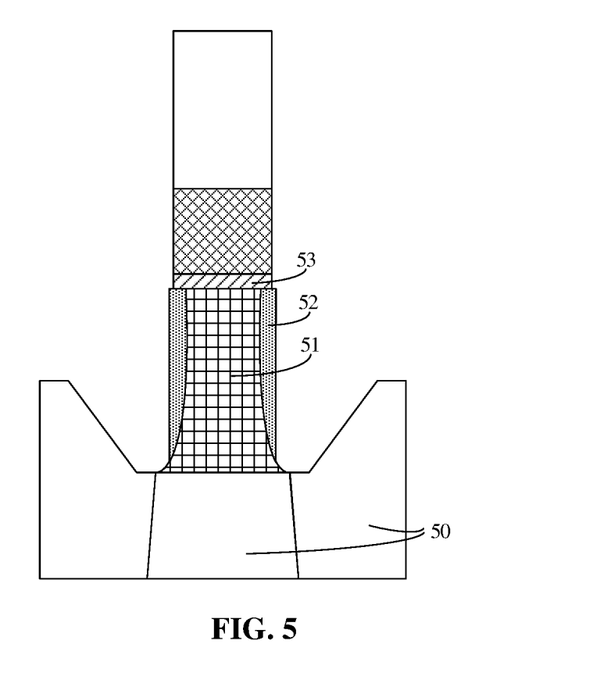
Figure 11:
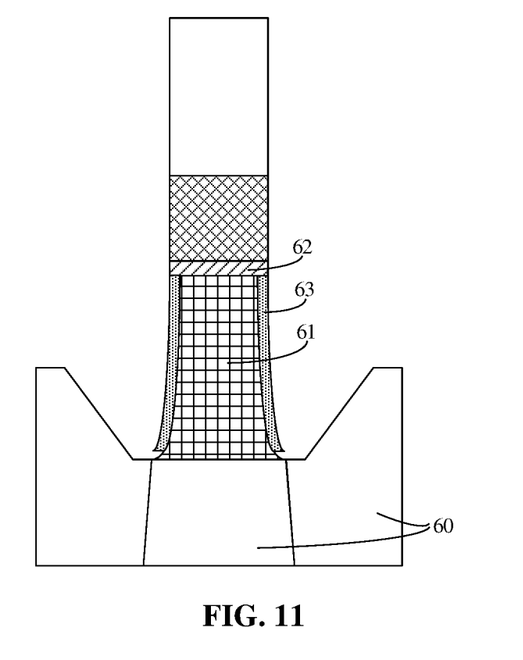
FIG. 11 is a sectional structure view corresponding to one in a method for manufacturing a semiconductor structure provided in another embodiment of the disclosure.

In other embodiments, referring to FIG. 8, if the first conductive layer 51 is etched before the metal film is formed, the structure shown in FIG. 5 or FIG. 11 can finally be formed. A difference between FIG. 11 and FIG. 5 is that in the direction from the second conductive layer 62 towards the substrate 60, the third conductive layer 63 has same width at different positions in FIG. 11. In the direction parallel to the surface of the substrate 60, the third conductive layer 63 has a protrusion relative to the second conductive layer 62 in FIG. 11. If this part is removed, the structure is the same as that shown in FIG. 5.

In the present embodiment, the third conductive layers having a lower contact resistance with the second conductive layer are set, so that a total contact resistance between the second conductive layer and other active regions is reduced, thus further reducing resistance on the conductive path disposed between the second conductive layer and the substrate and ensuring that the current signal passing from the second conductive layer to the substrate has a better signal transmission effect.

Those of ordinary skill in the art can understand that the above-mentioned implementation modes are specific embodiments for realizing the disclosure, and in actual applications, various changes can be made in form and details without departing from the spirit and scope of the disclosure. Any person skilled in the art can make their own changes and modifications without departing from the spirit and scope of the disclosure. Therefore, the protection scope of the disclosure shall be subject to the scope defined by claims.

The invention claimed is:

1. A semiconductor structure, comprising:
a substrate and a first conductive layer disposed on the substrate;
a second conductive layer disposed on a surface of the first conductive layer away from the substrate; and
third conductive layers covering side walls of the first conductive layer and in contact with the second conductive layer, wherein contact resistance between the third conductive layers and the second conductive layer is less than contact resistance between the first conductive layer and the second conductive layer,
wherein a top surface of each third conductive layer is in contact with a bottom surface of the second conductive layer.

2. The semiconductor structure of claim 1, wherein each side wall of the first conductive layer comprises a first sub-side wall and a second sub-side wall which extend upward from a bottom of the first conductive layer; the first sub-side wall is disposed between the second sub-side wall and the bottom of the first conductive layer; and each third conductive layer covers a respective second sub-side wall.

3. The semiconductor structure of claim 2, wherein in a direction perpendicular to a surface of the substrate, a ratio of a height of the second sub-side wall to a height of the first sub-side wall is 5 to 10.

4. The semiconductor structure of claim 2, wherein in a direction perpendicular to a surface of the substrate, the first conductive layer is further disposed between the third conductive layers and the substrate.

5. The semiconductor structure of claim 1, wherein in a direction parallel to a surface of the substrate, a top width of each third conductive layer is greater than a bottom width of the third conductive layer.

6. The semiconductor structure of claim 5, wherein in the direction parallel to the surface of the substrate, a top width of the first conductive layer is less than a bottom width of the first conductive layer.

7. The semiconductor structure of claim 5, wherein surfaces of the side walls of the first conductive layer are curved surfaces; and in a direction from the second conductive layer towards the substrate, a width of the first conductive layer in the direction parallel to the surface of the substrate increases gradually.

8. The semiconductor structure of claim 1, wherein an active region is disposed within the substrate; the first conductive layer is in contact with the active region; and the active region comprises an N-type doped semiconductor layer.

9. The semiconductor structure of claim 1, further comprising a metal conductive layer and a top-layer dielectric layer, wherein the metal conductive layer is disposed on a side of the second conductive layer away from the first conductive layer; the top-layer dielectric layer is disposed on a side of the metal conductive layer away from the substrate; and the first conductive layer, the second conductive layer, the third conductive layers, the metal conductive layer and the top-layer dielectric layer form a bit line structure.

10. The semiconductor structure of claim 1, wherein a material of the first conductive layer comprises polycrystalline silicon, and materials of the second conductive layer and the third conductive layers comprise metal compounds.

11. The semiconductor structure of claim 10, wherein a material of the second conductive layer comprises titanium nitride, and a material of the third conductive layers comprises cobalt silicide or titanium silicide.

12. A method for manufacturing a semiconductor structure, comprising:
providing a substrate and a bit line structure disposed on the substrate, wherein the bit line structure comprises a first conductive layer, a second conductive layer, a metal conductive layer and a top-layer dielectric layer which are stacked in sequence; and
forming third conductive layers covering side walls of the first conductive layer and in contact with the second conductive layer, wherein contact resistance between the third conductive layers and the second conductive layer is less than contact resistance between the first conductive layer and the second conductive layer.

13. The method for manufacturing a semiconductor structure of claim 12, wherein before the third conductive layers are formed, the first conductive layer is etched, so that a top width of the first conductive layer in a direction parallel to a surface of the substrate is less than a bottom width of the first conductive layer.

14. The method for manufacturing a semiconductor structure of claim 12, wherein a material of the first conductive layer comprises polycrystalline silicon, and materials of the second conductive layer and the third conductive layers comprise metal compounds.

15. The method for manufacturing a semiconductor structure of claim 12, wherein forming the third conductive layers comprises: forming metal layers covering the side walls of the first conductive layer; and transforming the metal layers into metal silicide layers to form the third conductive layers.

16. The method for manufacturing a semiconductor structure of claim 14, wherein forming the third conductive layers comprises: forming metal layers covering the side walls of the first conductive layer; and transforming the metal layers into metal silicide layers to form the third conductive layers.

17. The method for manufacturing a semiconductor structure of claim 15, wherein forming the metal silicide layers comprises: performing a high-temperature process so that the first conductive layer and the metal layers react with each other to form the metal silicide layers.

18. The method for manufacturing the semiconductor structure of claim 15, wherein forming the metal layers covering the side walls of the first conductive layer comprises: forming a metal film which covers an exposed surface of the substrate and an exposed surface of the bit line structure; and removing the metal film on the exposed surface of the substrate to form the metal layers, wherein the metal layers at least cover parts of the side walls of the first conductive layer, side walls of the second conductive layer and side walls of the metal conductive layer.

19. The method for manufacturing the semiconductor structure of claim 18, further comprising: after forming the third conductive layers, removing the unreacted metal layers on side walls of the bit line structure.

20. A semiconductor structure, comprising:
a substrate and a first conductive layer disposed on the substrate;
a second conductive layer disposed on a surface of the first conductive layer away from the substrate; and
third conductive layers covering side walls of the first conductive layer and in contact with the second conductive layer, wherein contact resistance between the third conductive layers and the second conductive layer is less than contact resistance between the first conductive layer and the second conductive layer,
wherein each side wall of the first conductive layer comprises a first sub-side wall and a second sub-side wall which extend upward from a bottom of the first conductive layer; the first sub-side wall is disposed between the second sub-side wall and the bottom of the first conductive layer; and each third conductive layer covers a respective second sub-side wall.

* * * * *